US012687594B2

(12) United States Patent
Salit et al.

(10) Patent No.: US 12,687,594 B2
(45) Date of Patent: Jul. 21, 2026

(54) MRI AND MEG DETECTION WITH A SINGLE OPTICALLY PUMPED MAGNETOMETER

(71) Applicant: Honeywell International Inc., Charlotte, NC (US)

(72) Inventors: Mary Salit, Plymouth, MN (US); Argyrios Dellis, Plymouth, MN (US); Kenneth Salit, Plymouth, MN (US)

(73) Assignee: Honeywell International Inc., Charlotte, NC (US)

( * ) Notice: Subject to any disclaimer, the term of this patent is extended or adjusted under 35 U.S.C. 154(b) by 309 days.

(21) Appl. No.: 18/508,084

(22) Filed: Nov. 13, 2023

(65) Prior Publication Data

US 2024/0255593 A1     Aug. 1, 2024

Related U.S. Application Data

(60) Provisional application No. 63/482,212, filed on Jan. 30, 2023.

(51) Int. Cl.
G01R 33/26 (2006.01)
G01R 33/32 (2006.01)

(52) U.S. Cl.
CPC ........... G01R 33/26 (2013.01); G01R 33/323 (2013.01)

(58) Field of Classification Search
CPC .............................. G01R 33/26; G01R 33/323
USPC ....................................... 324/206.1, 300–307
See application file for complete search history.

(56) References Cited

U.S. PATENT DOCUMENTS

| | | | |
|---|---|---|---|
| 8,519,705 B2 | 8/2013 | Savukov et al. | |
| 8,624,682 B2 | 1/2014 | Ridley et al. | |
| 9,395,425 B2 * | 7/2016 | Diamond | A61B 5/245 |
| 9,857,441 B2 | 1/2018 | Salit et al. | |

(Continued)

FOREIGN PATENT DOCUMENTS

| | | |
|---|---|---|
| CN | 111281370 A | 6/2020 |
| JP | 2012095939 A | 5/2012 |

OTHER PUBLICATIONS

Capilla et al., The natural frequencies of the resting human brain: An MEG based atlas, NeuroImage, vol. 258, (2022) 119373, Jun. 11, 2022, pp. 1 through 13.

(Continued)

*Primary Examiner* — Lee E Rodak
*Assistant Examiner* — Taqi R Nasir
(74) *Attorney, Agent, or Firm* — Fogg & Powers LLC

(57) ABSTRACT

Systems for MRI and MEG detection with a single optically pumped magnetometer are provided herein. In one example, a system comprises a chip-scale device including a RF atomic magnetometer, which includes a laser configured to emit laser light, a photodetector, a vapor cell between the laser and photodetector, and a circular polarizer configured to circularly polarize the laser light emitted by the laser. A circularly polarized laser beam is configured to pump into an oriented state, spins of atoms in the vapor cell and to probe the atoms in the vapor cell, wherein probing includes detecting a local RF field. The chip-scale device further includes flux transformer coil(s) configured to couple RF signals from a source to the RF atomic magnetometer and DC coil(s) configured to generate a DC magnetic field oriented at 45 degrees relative to an optical axis of the laser light emitted by the laser.

20 Claims, 7 Drawing Sheets

(56)          References Cited

U.S. PATENT DOCUMENTS

| | | | | |
|---|---|---|---|---|
| 2010/0090697 A1* | 4/2010 | Savukov | ............... | G01R 33/26 |
| | | | | 324/309 |
| 2012/0313717 A1* | 12/2012 | Ridley | ................... | G04F 5/145 |
| | | | | 29/825 |
| 2014/0354278 A1* | 12/2014 | Subbarao | ............ | G01R 33/445 |
| | | | | 324/309 |
| 2018/0242865 A1 | 8/2018 | Yamagata | | |
| 2022/0304615 A1* | 9/2022 | Mifune | ................. | A61B 5/245 |

OTHER PUBLICATIONS

Hilschenz et al., "Remote detected Low-Field MRI using an optically pumped atomic magnetometer combined with a liquid cooled pre-polarization coil", Journal of Magnetic Resonance, vol. 274, Nov. 18, 2016, pp. 89 through 94.
Kitching, "Chip-scale atomic devices", Applied Physics Reviews, vol. 5, Aug. 14, 2018, pp. 031302-1 through 031302-38.
National Institute of Standards and Technology (NIST), "Detecting Brain Waves with Atomic Vapor", https://www.nist.gov/news-events/news/2016/07/detecting-brain-waves-atomic-vapor, Jul. 26, 2016, pp. 1 through 3, Published: US.
Sander et al., "Magnetoencephalography with a chip-scale atomic magnetometer", Biomedical Optics Express, vol. 3, No. 5, Apr. 17, 2012, pp. 981 through 990.
Savukov et al., "Anatomical MRI with an atomic magnetometer", available online Mar. 2013, pp. 1 through 13.
Savukov et al., "Detection of NMR signals with a radio-frequency atomic magnetometer", Journal of Magnetic Resonance, vol. 185, available online Dec. 23, 2006, pp. 214 through 220.
Savukov et al., "High-sensitivity operation of single-beam optically pumped magnetometer in a kHz frequency range", Measurement Science and Technology, vol. 28 (2017) 035104, Feb. 2, 2017, pp. Cover through 7.
Savukov et al., "Magnetic-resonance imaging of the human brain with an atomic magnetometer", Applied Physics Letters, vol. 103, Jul. 23, 2013, pp. 043703-1 through 04703-3.

Savukov et al., "Multi-flux-transformer MRI detection with an atomic magnetometer", available in PubMed Central Oct. 2014, pp. 1 to 13, published in final edited form in Journal of Magnetic Resonance, vol. 294.
Savukov et al., "Tunable Atomic Magnetometer for Detection of Radio-Frequency Magnetic Fields", Physical Review Letters, vol. 95, Issue 6, Aug. 3, 2005, pp. 63004-1 through 63004-4.
Savukov et al., "Detection of ultra-low field NMR signal with a commercial QuSpin single-beam atomic magnetometer", Open Manuscript, available online Jul. 2020, pp. 1 through 19.
Schwindt et al., "Atomic Magnetometer for Human Magnetoencephalograpy", Sandia National Laboratories, Sandia Report SAND2010-8443, Printed Dec. 2010, pp. 1 through 41; Published in: US.
Schwindt et al., "Chip-scale atomic magnetometer with improved sensitivity by use of the Mx technique", Applied Physics Letters, vol. 90, 081102 (2007), Feb. 21, 2007, pp. 081102-1 through 081102-3.
Seymour et al., "Using OPMs to measure neural activity in standing, mobile participants", NeuroImage, vol. 224 (2021) 118604, Sep. 21, 2021, pp. 1 through 11.
Shah et al., "A Compact, High Performance, Atomic Magnetometer for Biomedical Applications", Author Manuscript, published in final edited form in Physics in Medicine & Biology, Nov. 21, 2013, 58(22), pp. 1 through 12.
Tang et al., "High-sensitivity operation of a single-beam atomic magnetometer for three-axis magnetic field measurement", Optics Express, vol. 29, No. 10, May 6, 2021, pp. 15641 through 15652.
Xu et al., "Magnetic resonance imaging with an optical atomic magnetometer", PNAS, vol. 103, No. 34, Aug. 22, 2006, pp. 12668 through 12671.
Zotev et al., "Microtesla MRI of the human brain combined with MEG", Author Manuscript, published in final edited form in Journal of Magnetic Resonance, vol. 194, Issue 1, Sep. 2008, pp. 1 through 14.
Zotev et al., "Multi-Sensor system for simultaneous ultra-low field MRI and MEG", Elsevier, International Congress Series, vol. 1300, 2007, Jun. 2007, pp. 631 through 634.

* cited by examiner

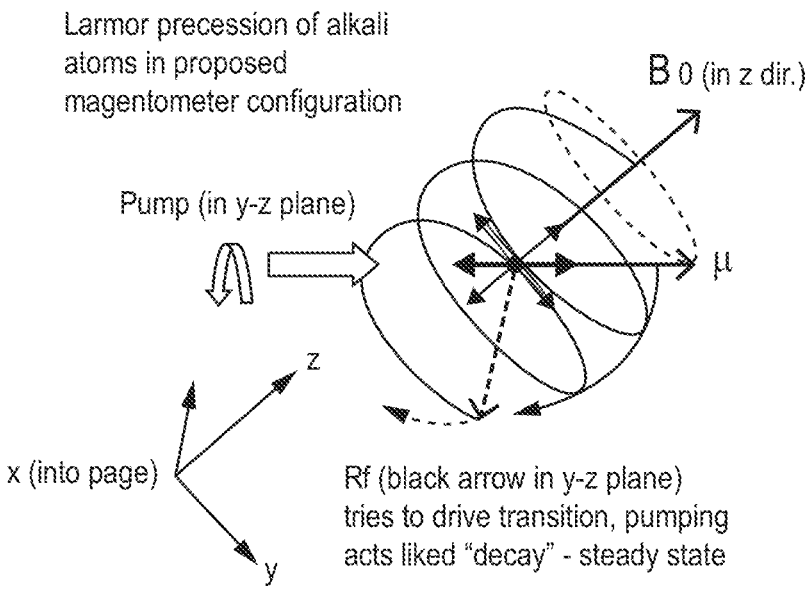

Larmor precession of alkali atoms in proposed magentometer configuration

B 0 (in z dir.)

Pump (in y-z plane)

μ x (into page)

z y

Rf (black arrow in y-z plane) tries to drive transition, pumping acts liked "decay" - steady state

FIG. 4A

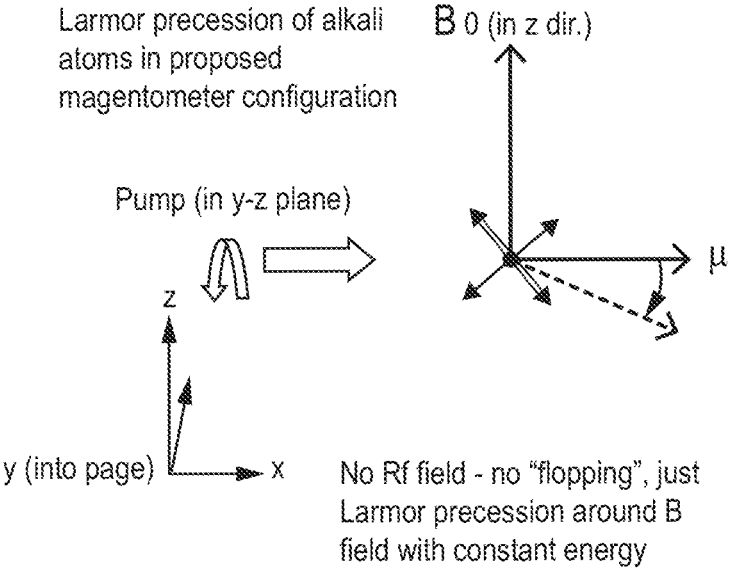

Larmor precession of alkali atoms in proposed magentometer configuration

B 0 (in z dir.)

Pump (in y-z plane)

μ z y (into page)

x

No Rf field - no "flopping", just Larmor precession around B field with constant energy

FIG. 4B

MRI AND MEG DETECTION WITH A SINGLE OPTICALLY PUMPED MAGNETOMETER

CROSS-REFERENCE TO RELATED APPLICATIONS

This application claims priority to U.S. Provisional Application No. 63/482,212 filed on Jan. 30, 2023, and titled "MRI AND MEG DETECTION WITH A SINGLE OPTICALLY PUMPED MAGNETOMETER," the contents of which are incorporated by reference herein in their entirety. This application is related to U.S. Pat. No. 9,164,491 issued on Oct. 20, 2015, and titled "VAPOR CELL ATOMIC CLOCK PHYSICS PACKAGE," and U.S. Pat. No. 9,857, 441, issued on Jan. 2, 2018, and titled "SINGLE BEAM RADIO FREQUENCY ATOMIC MAGNETOMETER," the contents of all of which are incorporated herein by reference.

BACKGROUND

Magnetic Resonance Imaging (MRI) is a vital diagnostic tool for brain injuries. However, clinical studies have shown that over half of the mild-to-moderate traumatic brain injury cases that are severe enough to cause psychological changes to the brain but cannot be detected by MRI alone can be detected with the addition of magnetoencephalography (MEG). The combination of MRI and MEG (sometimes referred to collectively as Magnetic Source Imaging (MSI)) allows the structure and activity of the brain to be understood together, and possibly lead to a new understanding of brain function and interventions that can be employed to improve it.

The use of MRI is currently limited by the expensive and immobile equipment it requires. The cost and size of this equipment is dominated by the cost and size of the large, superconducting magnets needed to produce the approximately 1 T fields used in conventional MRI. Cryogenically cooled magnets of that size and cost cannot be deployed at temporary or mobile sites. Similarly, cryogenic cooling is needed for the type of superconducting quantum interference device (SQUID) magnetometers commonly used for MEG. MEG is an even more sensitive diagnostic tool than MRI, and more widespread availability could improve outcomes for patients with all types of brain injury.

SUMMARY

In some aspects, a system includes a chip-scale device. The chip-scale device includes a radio frequency atomic magnetometer that includes: a laser configured to emit laser light, a photodetector, a vapor cell in an optical path of laser light between the laser and photodetector, and a circular polarizer configured to circularly polarize the laser light emitted by the laser. A circularly polarized laser beam is configured to pump into an oriented state, spins of atoms in the vapor cell and to probe the atoms in the vapor cell, wherein probing includes detecting a local radio frequency field. The chip-scale device further includes one or more flux transformer coils configured to couple radio frequency signals from a source to the radio frequency atomic magnetometer. The chip-scale device further includes a set of direct current (DC) coils comprising at least one coil, wherein the set of DC coils is configured to generate a DC magnetic field oriented at 45 degrees relative to the optical axis of the laser light emitted by the laser.

In some aspects, the system further includes a passive magnetic shield surrounding the radio frequency atomic magnetometer and the set of DC coils.

In others aspects, the system further includes one or more controllers and a second magnetometer. The one or more controllers are communicatively coupled to the set of DC coils and the second magnetometer. The second magnetometer is configured to detect an external DC field and provide a measurement of the external DC field to the one or more controllers. The one or more controllers are configured to adjust a DC electrical bias for the set of DC coils to mitigate the detected external DC field.

In some aspects, the system includes a plurality of chip-scale devices described above and arranged in an array.

In some aspects, a system includes a plurality of chip-scale devices arranged in an array. Each respective chip-scale device of the plurality of chip-scale devices includes a radio frequency atomic magnetometer that includes: a laser configured to emit laser light, a photodetector, a vapor cell in an optical path of laser light between the laser and photodetector, and a circular polarizer configured to circularly polarize the laser light emitted by the laser. A circularly polarized laser beam is configured to pump into an oriented state, spins of atoms in the vapor cell and to probe the atoms in the vapor cell, wherein probing includes detecting a local radio frequency field. Each respective chip-scale device of the plurality of chip-scale devices further includes one or more flux transformer coils configured to couple radio frequency signals from a source to the radio frequency atomic magnetometer. Each respective chip-scale device of the plurality of chip-scale devices further includes a set of direct current (DC) coils comprising at least one coil, wherein the set of DC coils is configured to generate a DC magnetic field oriented at 45 degrees relative to an optical axis of the laser light emitted by the laser.

In some aspects, a system includes a chip-scale device. The chip-scale device includes: a radio frequency atomic magnetometer that includes a laser configured to emit laser light, a photodetector, a vapor cell in an optical path of laser light between the laser and photodetector, and a circular polarizer configured to circularly polarize the laser light emitted by the laser. A circularly polarized laser beam is configured to pump into an oriented state, spins of atoms in the vapor cell and to probe the atoms in the vapor cell, wherein probing includes detecting a local radio frequency field. The chip-scale device further includes one or more flux transformer coils configured to couple radio frequency signals from a source to the radio frequency atomic magnetometer. The chip-scale device further includes a set of direct current (DC) coils comprising at least one coil. The set of DC coils is configured to generate a DC magnetic field oriented at 45 degrees relative to an optical axis of the laser light emitted by the laser. The system further includes a second magnetometer configured to detect an external DC field. The system further includes one or more processors communicatively coupled to the chip-scale device and the second magnetometer. The system is configured to operate in a magnetic resonance imaging (MRI) mode of operation and a magnetoencephalography (MEG) mode of operation.

BRIEF DESCRIPTION OF THE DRAWINGS

Embodiments of the present invention can be more easily understood and further advantages and uses thereof more readily apparent, when considered in view of the description and the following figures in which:

FIG. 4A is a diagram of Larmor precession for MRI operation;

FIG. 4B is a diagram of Larmor precession for MEG operation;

In accordance with common practice, the various described features are not drawn to scale but are drawn to emphasize features relevant to the present invention. Reference characters denote like elements throughout figures and text.

DETAILED DESCRIPTION

Figure 1:
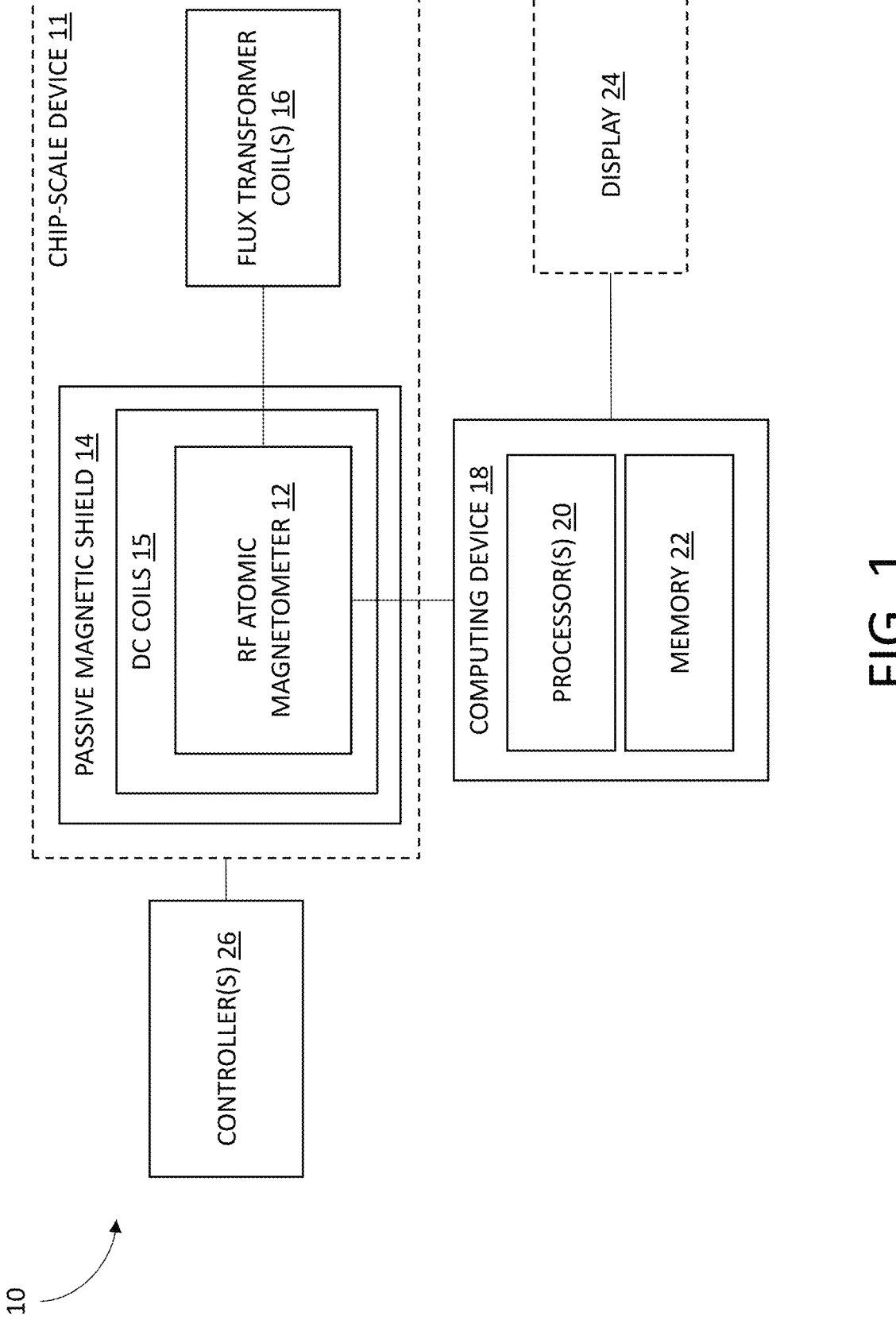
FIG. 1 is a diagram of an example system for performing MRI measurements.

In the following detailed description, reference is made to the accompanying drawings that form a part hereof, and in which is shown by way of specific illustrative embodiments in which the invention may be practiced. These embodiments are described in sufficient detail to enable those skilled in the art to practice the invention, and it is to be understood that other embodiments may be utilized and that logical, mechanical and electrical changes may be made without departing from the scope of the present invention. The following detailed description is, therefore, not to be taken in a limiting sense.

As discussed above, MRI and MEG technologies each use large, expensive superconducting systems that require cryogenic cooling. These technologies are typically difficult to combine and generally inaccessible in non-hospital/scientific settings or in underinvested communities. MRI signals generated and sensed at millitesla (mT) field strengths with sufficient resolution have additional applications separate from the possibilities of combined MRI and MEG.

Low-Field Nuclear Magnetic Resonance (LF-NMR) and zero-magnetic-field Nuclear Quadrupole Resonance (NQR) can be used for imaging applications such as MRI or for spectroscopy to determine chemical composition and material properties. Typically, low-field and zero-field measurements have lower signal-to-noise levels than are achievable in traditional, high-field NMR and MRI, but these measurements can be used to detect different properties, including some which have security applications, such as the spectroscopic fingerprints of different explosives, and potentially some nuclear and biological materials as well. The signal-to-noise-ratio of MRI declines with decreasing field strength, so low-field MRI benefits from sensitive detectors. Ultra-low Field-MRI systems using low-$T_c$ Superconducting Quantum Interference Devices (SQUIDs) have successfully imaged the human brain, but still require cryogenic cooling, limiting their practical value for field medicine.

Many low-field techniques eliminate the need for large superconducting magnets as in traditional high-field NMR and MRI, which allows low-field NMR and NQR systems potentially to be more portable, miniaturizable, and lower power. Miniaturized MRI systems would allow traumatic brain injuries to be detected in the field, improving clinical outcomes by enabling early diagnosis and treatment. At mT field strengths, imaging can be done with traditional radio frequency transmission and reception antennas. However, the signal-to-noise of these systems is limited, at low fields, by the fact that the corresponding signal frequencies are in the kilohertz regime, where the long wavelength means that small antennas do not have ideal performance, and where Johnson noise is significant.

For at least the reasons discussed above, there is a need in the art for more affordable and portable solutions for MRI and MEG technologies.

The systems described herein provide chip-scale devices configured to perform MRI and/or MEG measurements. The chip-scale device includes an RF atomic magnetometer, one or more flux transformer coils configured to couple RF signals from a sample to the RF atomic magnetometer, and a set of DC coils configured to generate a DC magnetic field. In some examples, the chip-scale device further includes a passive magnetic shield and is configured to perform MRI measurements only. In other examples, the chip-scale device utilizes the set of DC coils to actively mitigate undesired magnetic fields and tune the DC magnetic field that is applied to the RF atomic magnetometer for performing the MRI measurements. In some such examples, the chip-scale device is configured to deactivate the set of DC coils and operate as a Spin Exchange Relaxation-Free (SERF) magnetometer to perform MEG measurements. Multiple chip-scale devices can be grouped together to form an array that can be used to produce MRI and MEG measurements for larger sample sizes.

FIG. 1 is a block diagram of an example system 10 for performing MRI measurements. In the example shown in FIG. 1, the system 10 includes a chip-scale device 11 communicatively coupled to at least one computing device 18 that includes at least one processor 20 coupled to a memory 22.

In the example shown in FIG. 1, the chip-scale device 11 includes an RF atomic magnetometer 12, a passive magnetic shield 14, a set of DC coils 15, and one or more flux transformer coils 16. In the example shown in FIG. 1, the set of DC coils 15 surrounds the RF atomic magnetometer 12, and the passive magnetic shield surrounds both the RF atomic magnetometer 12 and the set of DC coils 15. In some examples, the system 10 further includes one or more controllers 26 communicatively coupled to one or more components (for example, the set of DC coils 15, the RF atomic magnetometer 12, and/or the one or more flux transformer coils 16) of the chip-scale device 11. In some such examples, the one or more controllers 26 can be included in the computing device 18.

Figure 2A:
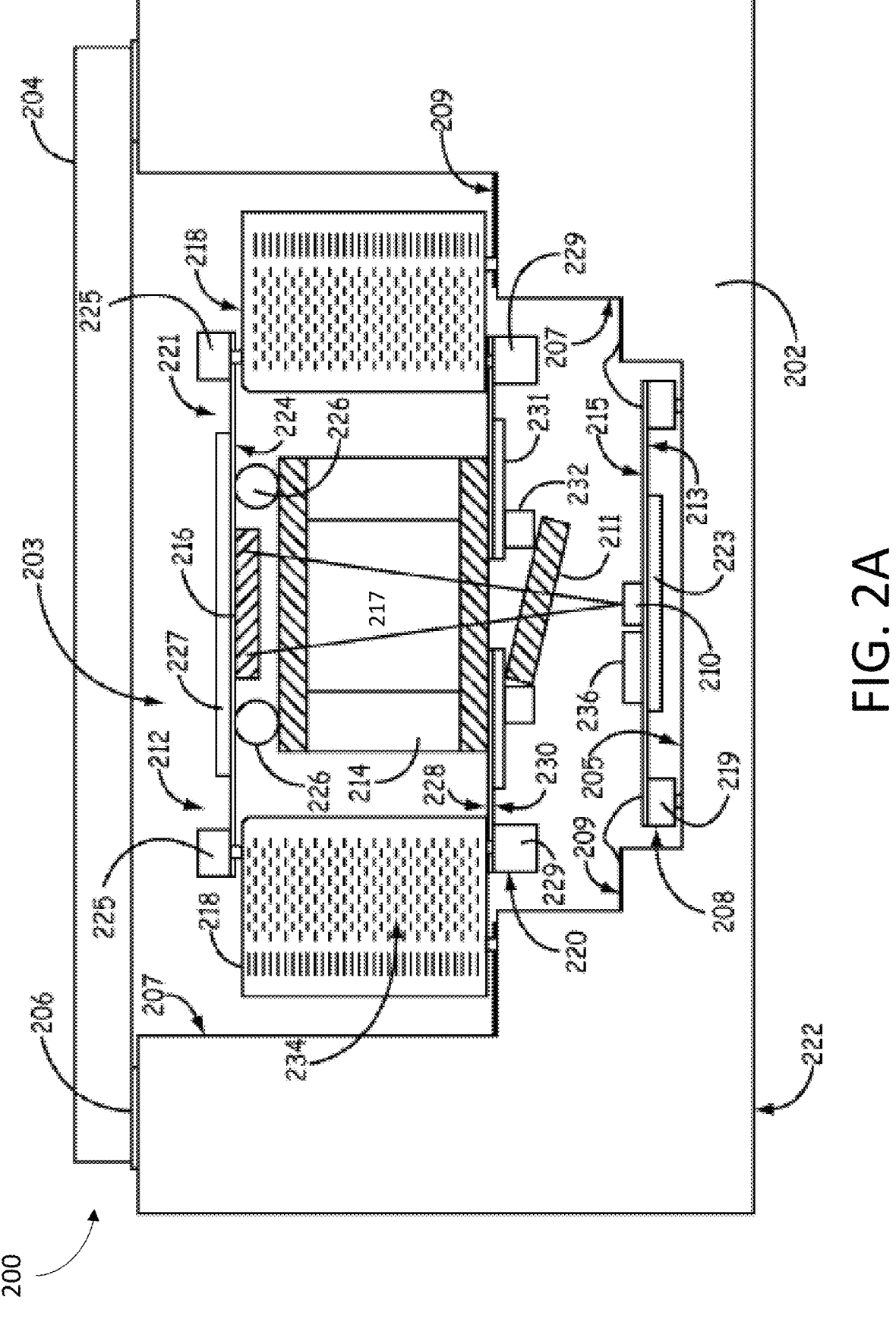
FIGS. 2A-2B are diagrams of example RF atomic magnetometers.
Figure 2B:
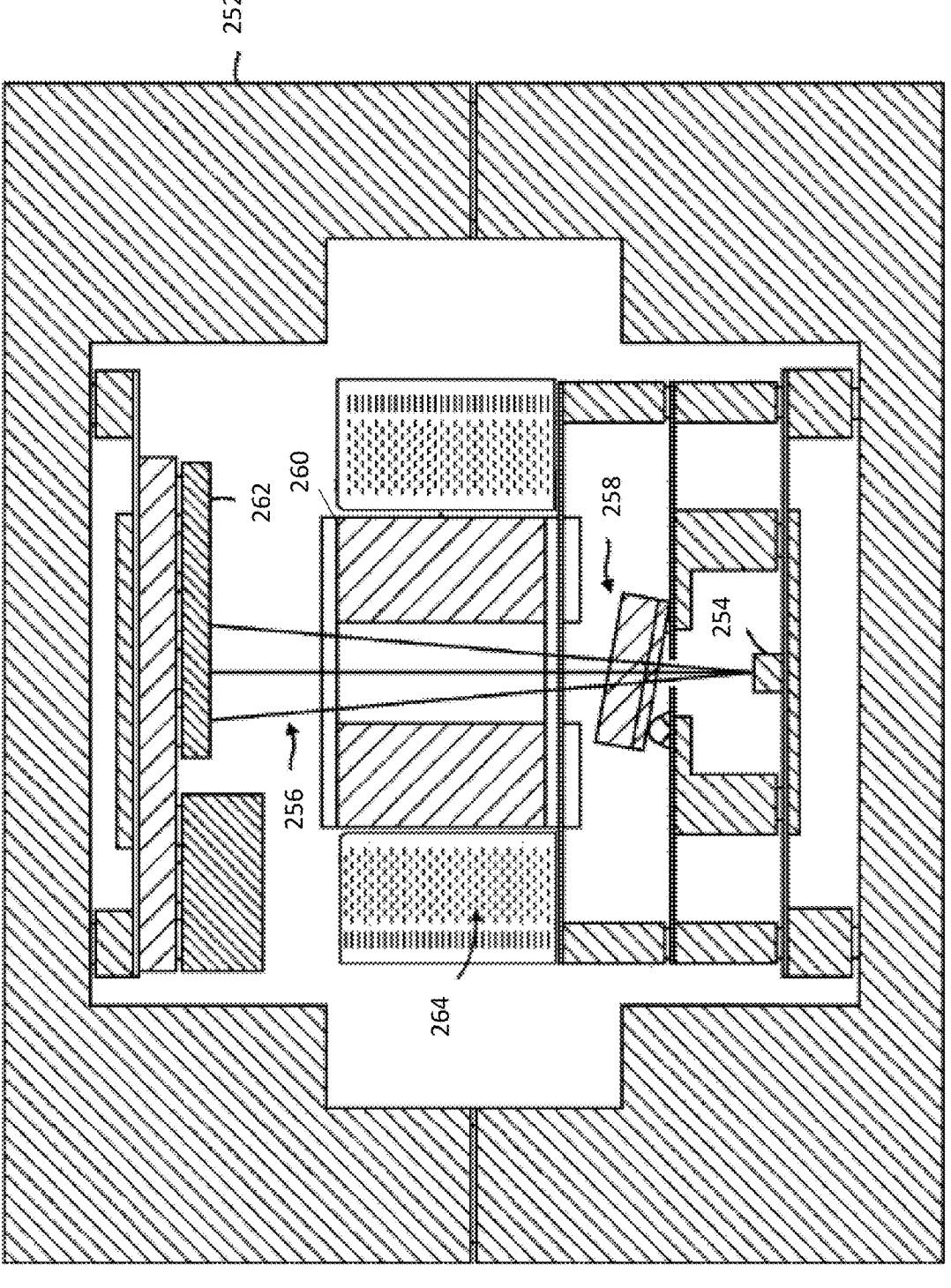

The RF atomic magnetometer 12 can be implemented using a variety of designs. In some examples, the RF atomic magnetometer 12 is a single-beam RF atomic magnetometer that utilizes a single laser beam to both optically pump and probe the atoms in a vapor cell. FIGS. 2A-2B illustrate example RF atomic magnetometers 200, 250 suitable for use as RF atomic magnetometer 12 in the chip-scale device 11.

FIG. 2A is a cross-sectional view of a first example RF atomic magnetometer 200 suitable for use as the RF atomic magnetometer 12 in the chip-scale device 11. The RF atomic magnetometer 200 includes a ceramic body 202 defining a cavity 203 for housing components of the RF atomic magnetometer 200. The ceramic body 202 including the components in the cavity 203 can comprise a ceramic leadless chip carrier (CLCC) package. The RF atomic magnetometer 200 can also include a non-magnetic (for example, ceramic) lid 204 configured to fit over the cavity 203 of the ceramic body 202 to form a closed package encasing the cavity 203 and the components therein. In some examples, the ceramic lid 204 has a generally planar shape. In the example shown in FIG. 2A, a solder seal 206 is used to seal the lid 204 to the body 202. In an example, die attach and sealing operations for the RF atomic magnetometer 200 (for example, for sealing the lid 204 to the body 202) are accomplished without the use of flux to enable low pressure in the sealed package, which can enable lower power operation by minimizing thermal conductivity of the package and thus reducing the amount of heater power required to maintain a constant elevated temperature. In some examples, the lid 204 can be sealed to the body 202 in a vacuum. This design can enable batch vacuum sealing of the lid 204 to the body 202. The RF atomic magnetometer 200 can also include a getter film coating most of the interior surface of a ceramic lid 204.

In some examples, the ceramic body 202 has one side (for example, the top) open such that the body 202 defines the cavity 203. The lid 204 is configured to cover the open side of the body 202 to enclose the cavity 203. In some examples, the cavity 203 has a shape generally pentagonal cross section when viewed from the open side (for example, top). In other examples, the cavity 203 has a generally circular cross-section when viewed from the open side (for example, top). In any case, the cavity 203 can include a base surface 205 and one or more interior sides 207. In the example shown in FIG. 2A, the one or more sides 207 have one or more steps 209 defined therein for, for example, supporting structures within the cavity of the body 202.

In the example shown in FIG. 2A, the RF atomic magnetometer 200 includes one or more scaffolds 208, 212, 220 for supporting components such as a laser 210, circular polarizer 211, vapor cell 214, and photodetector 216. In some examples, a scaffold 208, 212, 220 can include a membrane suspended between a frame. The scaffolds 208, 212, 220 can also include a stiffening member attached to the membrane to provide additional structure for the membrane. To produce the scaffolds 208, 212, 220 at a size that can be used for the RF atomic magnetometer 200, the scaffolds 208, 212, 220 can be fabricated using semiconductor fabrication processes. Accordingly, the frame and stiffening member can be composed of silicon and the membrane can be composed of polyimide. The polyimide can thermally isolate the stiffening member and components on the scaffolds 208, 212, 220 from the frame and body 202.

In the example shown in FIG. 2A, the RF atomic magnetometer 200 includes a lower scaffold 208, an upper scaffold 212, and a middle scaffold 220 that are mounted in the cavity 203. In some examples, the lower scaffold 208, the upper scaffold 212, and the middle scaffold 220 can be disposed parallel to one another and parallel to the base surface 205 of the cavity 203. In some such examples, the lower scaffold 208 is attached to the base surface 205 of the cavity 203 via fluxless die attach (for example, a plurality of gold (Au) stud bumps). The lower scaffold 208 is configured to function as a support structure for the laser 210 and, in some examples, a heater (not shown). The lower scaffold 208 and components thereon (for example, laser 210) can be electrically coupled to pins on the body 202 via wire bonds to a pad on a lower step 209 of the inner side surface 207 of the cavity 203 of the ceramic body 202. In some examples, the laser 210 can be a vertical cavity surface emitting laser (VCSEL).

In the example shown in FIG. 2A, the lower scaffold 208 includes a first side 213 that opposes the base surface 205 and a second side 215 that is reverse of the first side 213 and facing the lid 204, the middle scaffold 220, and the upper scaffold 212. In the example shown in FIG. 2A, the frame 219 and the stiffening member 223 are on the first side 213.

In some examples, the stiffening member 223 can define a plurality of apertures to reduce the mass thereof. In the example shown in FIG. 2A, the laser 210 is mounted to the second side 215. In some examples, the laser 210 can be solder bonded to the second side 215 using, for example, flip-chip mounting.

As mentioned above, the lower scaffold 208 can include a membrane having a frame 219 and a stiffening member 223 attached thereto. The frame 219 and the stiffening member 223 can be separated from one another on the membrane with a plurality of tethers (not shown) of the membrane extending between the frame 219 and the stiffening member 223. A plurality of stud bumps (not shown) can be on the frame 219 to attach the frame 219 to the body 202. Components (for example, the laser 210) can be mounted on the membrane in the area of the stiffening member 223. Traces can extend across the tethers to electrically couple the components on the stiffening member to the stud bumps.

In the example shown in FIG. 2A, the upper scaffold 212 and middle scaffold 220 are mounted on opposite sides of one or more spacers 218 (for example, leg structure, washer). The upper scaffold 212 is configured to function as a support structure for the photodetector 216, and the middle scaffold 220 is configured to function as a support structure for the circular polarizer 211. In addition, the upper scaffold 212 and middle scaffold 220 are configured to function as a support structure for the alkali vapor cell 214. In particular, the vapor cell 214 can be supported between the upper scaffold 212 and the middle scaffold 220. Accordingly, in the example shown in FIG. 2A, the vapor cell 214 is attached to the upper scaffold 212 on one end and the middle scaffold 220 on the opposite end. Moreover, the vapor cell 214 can be disposed within an aperture of the spacer 218. Accordingly, the upper scaffold 212, middle scaffold 220, and the spacer 218 form a support structure for the vapor cell 214. In some examples, a heater (not shown) for the upper surface of the vapor cell 214 can be mounted on the upper scaffold 212 and/or a heater (not shown) for the lower surface of the vapor cell 214 can be mounted on the middle scaffold 220. In another example, one or more heaters can be fabricated on one or more surfaces of the vapor cell 214. In an example, the spacer 218 can have a ring shape (for example, a pentagon ring shape) defining an aperture therein. The spacer 218 can be disposed around the vapor cell 214 such that the vapor cell 214 is within the aperture defined in the spacer 218.

In an example, the spacer 218 can also function to reduce fatigue on the joint(s) coupling the upper scaffold 212 and the middle scaffold 220 to the upper step 209. The spacer 218 can reduce fatigue by being composed of a material that has a thermal expansion coefficient that is in between the thermal expansion coefficient of the body 202 and the thermal expansion coefficient of the upper scaffold 212 and middle scaffold 220. Accordingly, as the body 202, the upper scaffold 212, and the middle scaffold 220 expand and contract due to temperature changes, the spacer 218 can absorb some of the changes. For example, the body 202 can be composed of a ceramic having a thermal expansion coefficient of 7 ppm per degree Celsius, the spacer 218 can have a thermal expansion coefficient of 5 ppm per degree Celsius, and the upper scaffold 212 and middle scaffold 220 can have a thermal expansion coefficient of 3 ppm per degree Celsius. In another example, the spacer 218 can be formed of the same material as the body 202 and the lid 204. The spacer 218 can provide mechanical support and electrical contact for the upper scaffold 212 and middle scaffold 220. In some examples, the spacer 218 can also provide mechanical support and electrical contact for additional electronic components such as surface mount technology (SMT) electronics.

In the example shown in FIG. 2A, the spacer 218 with the upper scaffold 212 and middle scaffold 220 mounted thereon is mounted to a step 209 in the body 202. In particular, the spacer 218 is mounted to an upper step 209. Steps 209 in the sides 207 of the cavity 203 can be used to, at least partially, space the upper scaffold 212 and middle scaffold 220 from the lower scaffold 208. The spacer 218 extends up from the upper step 209 of the cavity 203 to further space the upper scaffold 212 from the lower scaffold 208 and middle scaffold 220 and provide space for the vapor cell 214 between the middle scaffold 220 and the upper scaffold 212. In some examples, the spacer 218 can be composed of ceramic.

The combination of the upper scaffold 212 and the spacer 218 can traverse the cavity 203 of the body 202 on a top portion of the spacer 218. Likewise, the middle scaffold 220 and the spacer 218 can traverse the cavity 203 of the body 202 on a bottom portion of the spacer 218. In an example, the upper scaffold 212 and the middle scaffold 220 can be attached to the spacer 218 via fluxless die attach. The spacer 218 can be attached via fluxless die attach to the upper step 209 of the body 202. In an example, the fluxless die attach can be a plurality of gold (Au) stud bumps.

In the example shown in FIG. 2A, the upper scaffold 212 includes a first side 221 that opposes the lid 204 and a second side 224 that is reverse of the first side 221 and facing the middle scaffold 220 and the lower scaffold 208. In the example shown in FIG. 2A, the frame 225 and the stiffening member 227 are on the first side 221. In some examples, the stiffening member 227 can define a plurality of apertures to reduce the mass thereof. In the example shown in FIG. 2A, the photodetector 216 and the vapor cell 214 are mounted to the second side 224, and the vapor cell 214 is disposed overtop of the photodetector 216 and aligned with the laser 210 and circular polarizer 211 such that a laser beam 217 from the laser 210 propagates through the circular polarizer 211, then through the vapor cell 214 and can be detected by the photodetector 216. In some examples, the photodetector 216 can be solder bonded to the second side 224 using, for example, flip-chip mounting. In the example shown in FIG. 2A, a plurality of solder balls 226 are attached to the second side 224 and disposed around the photodetector 216. The plurality of solder balls 226 project a height above the second side 224 that is higher than the photodetector 216 such that the vapor cell 214 can be soldered to the plurality of solder balls 226 and disposed overtop of the photodetector 216. In some examples, the vapor cell 214 can be disposed at least 200 micrometers apart from the photodetector 216. This gap can enable flux to be flushed from between the vapor cell 214 and the photodetector 216. In an example, the plurality of solder balls 226 can be formed using a jetting process tuned to produce solder balls of the desired size. In an example, the solder balls 226 can be formed of a solder having a high temperature melting point, such that, once formed on the scaffold 212, the solder balls 226 generally maintain their structure during further fabrication of the RF atomic magnetometer 200. In some examples, the vapor cell 214 can be an alkali vapor cell containing rubidium atoms.

In the example shown in FIG. 2A, the upper scaffold 212 is in a flipped position with respect to the lower scaffold 208 and the middle scaffold 220. That is, the frame 219 on the lower scaffold 208 and the middle scaffold 220 project in the opposite direction from the frame 225 of the upper scaffold 212. Additionally, the vapor cell 214 can be disposed in between the polyimide layers of the upper scaffold 212 and middle scaffold 220.

In the example shown in FIG. 2A, the upper scaffold 212 includes a membrane having a frame 225 and a stiffening member 227 attached thereto. The frame 225 and the stiffening member 227 can be separated from one another on the membrane with a plurality of tethers (not shown) of the membrane extending between the frame 225 and the stiffening member 227. A plurality of stud bumps (not shown) can be on the frame 225 to attach the frame 225 to the body 202. Components (for example, the vapor cell 214) can be mounted on the membrane in the area of the stiffening member 227. Traces can extend across the tethers to electrically couple the components on the stiffening member to the stud bumps.

In the example shown in FIG. 2A, the middle scaffold 220 includes a first side 228 that faces the lid 204 and opposes the upper scaffold 212 and a second side 230 that faces the base surface 205 and opposes the lower scaffold 208. In the example shown in FIG. 2A, the middle scaffold 220 can be mounted to the spacer 218 on the first side 228 of the scaffold 220.

In the example shown in FIG. 2A, the frame 229 and the stiffening member 231 are on the second side 230. In some examples, the stiffening member 231 can define a plurality of apertures to reduce the mass thereof. The vapor cell 214 is mounted on the first side 228 of the middle scaffold 220, and the circular polarizer 211 is mounted on the second side 230 of the middle scaffold 220. In the example shown in FIG. 2A, a plurality of tilting features 232 are fabricated into the second side 230 of the middle scaffold 220, and the circular polarizer 211 is mounted to these tilting features 232, which can be configured to orient the circular polarizer 211 at an angle with respect to the middle scaffold 220. For example, a first feature can have a lower height than a second feature, and a first edge of the circular polarizer 211 can be attached to the first feature and a second edge of the circular polarizer 211 can be attached to the second feature. Orienting the circular polarizer 211 at an angle can direct laser reflections off of the circular polarizer 211 away from the laser 210 and circularly polarize the laser beam 217. In some examples, the circular polarizer 211 includes a quarter waveplate and a linear polarizer.

In the example shown in FIG. 2A, the middle scaffold 220 includes a membrane having a frame 229 and a stiffening member 231 attached thereto. In some examples, the frame 229 and the stiffening member 231 can be separated from one another on the membrane with a plurality of tethers (not shown) of the membrane extending between the frame 229 and the stiffening member 231. In some examples, a plurality of stud bumps (not shown) can be on the frame 229 to attach the frame 229 to the body 202. Components (for example, the vapor cell 214) can be mounted on the membrane in the area of the stiffening member 231. Additionally, other components (for example, the circular polarizer 211) can be mounted on the stiffening member 231.

In some examples, one or more coils 234 are disposed about (for example, within) the spacer 218 such that the one or more coils 234 extends around the vapor cell 214. In other examples, the one or more coils 234 can be integrated into (for example, internal to) the spacer 218. The one or more coils 234 are coupled to the one or more flux transformer coils 16 discussed further below.

In the example shown in FIG. 2A, a second photodetector 236 is mounted to the second side 215 of the lower scaffold 208 adjacent the laser 210 and configured to detect reflections of the laser 210 from the circular polarizer 211. The second photodetector 236 can be used to control the light power output of the laser 210. In particular, based on the strength of the light reflected from the circular polarizer 211, the power output of the laser 210 can be determined and controlled accordingly.

The RF atomic magnetometer 200 can include an input/output (I/O) solder pad 222 on a bottom portion of the body 202. Thus, a bottom portion of the RF atomic magnetometer 200 can be attached to a circuit board. In some examples, interconnects between the I/O solder pad and internal components (for example, laser 210, circular polarizer 211, photodetector 216, vapor cell 214, and coils 234) can be routed through the body 202. In some examples, interconnects for components on the upper scaffold 212 (for example, photodetector 216) and middle scaffold 220 (for example, heater) can be routed through the spacer 218. Thus, the spacer 218 can include electrical traces on an internal or outside portion thereof.

FIG. 2B illustrates a cross-sectional view of another example RF atomic magnetometer 250 suitable for use as the RF atomic magnetometer 12 in the chip-scale device 11. The RF atomic magnetometer 250 shown in FIG. 2B includes a vacuum package 252 containing laser 254, a circular polarizer 258 (for example, a quarter wave plate and a linear polarizer), a vapor cell 260, and a photodetector 262. In some examples, the laser 254 is a vertical cavity surface emitting laser (VCSEL).

The vapor cell 260 is positioned between the laser 254 and the photodetector 262 in the optical path of the laser beam 256 emitted the by laser 254. In some examples, the vapor cell 260 is an alkali vapor cell containing alkali atoms (for example, rubidium or potassium atoms). In some examples, the vapor cell 260 also includes other gases which act as "buffer" and "quenching" gases as known to those having ordinary skill in the art. These typically include noble gases such as helium or argon, and diatomic molecules such as nitrogen (especially in the role of "quenching gas"). The circular polarizer 258 circularly polarizes the laser beam 256.

In the example shown in FIG. 2B, the vacuum package 252 also includes one or more coils 264, which are coupled to the one or more flux transformer coils 16 discussed further below. In some examples, the one or more coils 264 are disposed such that the magnetic coil extends around the vapor cell 260. In an example, the one or more coils 264 can be integrated into (for example, internal to) a spacer coupled next to the vapor cell 260.

Referring back to FIG. 1, the chip-scale device 11 of the system 10 is configured to directly sense Larmor precession of electrons in alkali atoms at frequencies up to hundreds of kilohertz. The RF signals to be detected, which are the MRI signals, are produced by Larmor precession of protons in hydrogen atoms (or other sample atoms) in the brain or another source.

The one or more coils 234, 264 that surround the vapor cell 214, 260 of the RF atomic magnetometer 12 are coupled to the one or more flux transformer coils 16. The one or more flux transformer coils 16 are configured to relay the RF parts of the field from the sample to the vapor cell 214, 260 of the RF atomic magnetometer 12 using the one or more coils 234, 264. In some examples, the one or more flux transformer coils 16 include a single coil. In other examples, the one or more of flux transformer coils 16 includes multiple small-diameter flux transformers coupled to the RF atomic magnetometer, which can produce better signal strength than a single coil covering the same sample volume. The smaller radius of each coil gives a more favorable relationship between field and coil current. Small coils also have less Johnson noise (because of the smaller total resistance) and smaller distance to the sample (in that coils with a diameter greater than that of the sample will have coil turns whose distance from the sample is determined by the coil size and not the position). In some examples, the one or more flux transformer coils 16 have a diameter of approximately 1.5 cm. However, it should be understood that the one or more flux transformer coil 16 can have a different diameter depending on the desired performance of the system 10.

In order to match the proton Larmor precession frequency from the sample to the electron Larmor precession frequency in a vapor cell 214, 260 of the RF atomic magnetometer 12, the alkali atoms in the vapor cell 214, 260 have to experience a different magnetic field strength than the sample atoms experience because protons and electrons have different gyromagnetic ratios. The atoms of vapor cell 214, 260 are sensitive only to RF fields at their resonant frequency, and that resonant frequency is tunable depending on the strength of the DC magnetic field induced by DC field coils 15.

In the example shown in FIG. 1, the RF atomic magnetometer 12 is shielded against the DC field imposed on the sample for MRI by the passive magnetic shield 14 that surrounds the RF atomic magnetometer 12 and the set of DC coils 15. To tune the resonant frequency of the atoms in the vapor cell 214, 260 such that the atoms in the vapor cell 214, 260 experience the proper magnetic field strength, the set of DC field coils 15, which surrounds the RF atomic magnetometer 12 (for example, outside the body 202 or vacuum package 252), are configured to, when an electrical DC bias is applied, provide a DC magnetic field oriented at 45 degrees to the optical axis of laser beam 217, 256. The strength of the DC magnetic field can be altered by adjusting the electrical DC bias applied to the DC field coils 15. In some examples, the one or more controllers 26 and/or the at least one processor 20 are configured to adjust the electrical DC bias applied to the DC field coils to properly tune the atoms in the vapor cell 214, 260.

In the examples described herein, the laser beam 217, 256 is configured such it acts as both a pump beam and probe beam, so the laser beam 217, 256 in the RF atomic magnetometer 250 is a single beam configured to both optically pump and probe the atoms in vapor cell 214, 260. As a result of the optical pumping, the atoms of the vapor cell 214, 260 are in an oriented magnetic state.

During operation, the laser 210, 254 of the RF atomic magnetometer 12 is held at a fixed frequency, and modulations on the detector signal induced by the effect of the RF field of the sample on the atoms of vapor cell 214, 260 are detected. The RF field, which is coupled to the atoms of the vapor cell 214, 260 using the one or more flux transformer coils 16 and the one or more coils 234, 264, has the effect of driving transitions among the Zeeman sublevels of the atom.

If the direction of the DC field is defined as the "Z-direction" and the RF magnetic field lies in the Y-Z plane bisecting the angle between the two axes: the Z-component of the RF modulates the DC field Bo, and would cause so called "Pi" transitions if any transitions coupled by "Pi" polarized light were resonant at that frequency. In general, however, no such transitions will be allowed among Zeeman sublevels, and the effect of this component can be ignored. The Y-component of RF magnetic field, by contrast, is a superposition of left-circularly and right-circularly polarized fields, and will tend to couple the Zeeman sublevels to one another in such a way as to drive, in the absence of decay or pumping Rabi flopping among neighboring levels. During this Rabi flopping process, the magnetic moment would tend to rotate around y-axis to x-axis and then negative z-axis, while spiraling (Larmor precessing) around the z-axis. However, the optical pumping effect of the optical field counteracts this tendency. The result is a behavior in which the Larmor precession continues, but the Rabi flopping and optical pumping processes reach a steady state. An example diagram of the Larmor precession for MRI operation is provided in FIG. 4A.

The Larmor precession of the electrons in the vapor cell 214, 260 of the RF atomic magnetometer 12, being driven by the RF field of the sample rather than being spontaneous, has a common phase for all of the atoms. Because of this, it imposes a modulation on the amplitude of the optical field. The absorption of the laser light by the atoms in the vapor cell 214, 260 is a function of the orientation of the magnetic moment vector due to the selection rules for circularly polarized light. In the absence of the RF field, each atom in the vapor cell 214, 260 still Larmor precesses individually, but the phases of these precession processes are random, so there is no net optical signal. The RF field of the sample is sensed using the photodetector 216, 262 based on the phase it imposes on the atoms in the vapor cell 214, 260.

The photodetector 216, 262 is configured to output the detected signals to the computing device 18 for further processing. In some examples, the memory 22 includes one or more instructions that, when executed by the at least one processor 20, cause the at least one processor 20 to analyze the signals from the chip-scale device 11. In some examples, the at least one processor 20 is configured to process the signals from the chip-scale device 11 and output MRI measurements.

In some examples, the system 10 further optionally includes a display 24 communicatively coupled to the computing device 18, and can be configured to display the MRI measurements or images generated from the MRI measurements. The display can be, but is not limited to, a cathode ray tube (CRT) display, an active-matrix liquid crystal display (LCD), a passive matrix LCD, light emitting diode (LED) display, or plasma display. It can also be a simple indicator such an LED light signal, or an incandescent light bulb, to indicate a positive or negative result.

Figure 3:
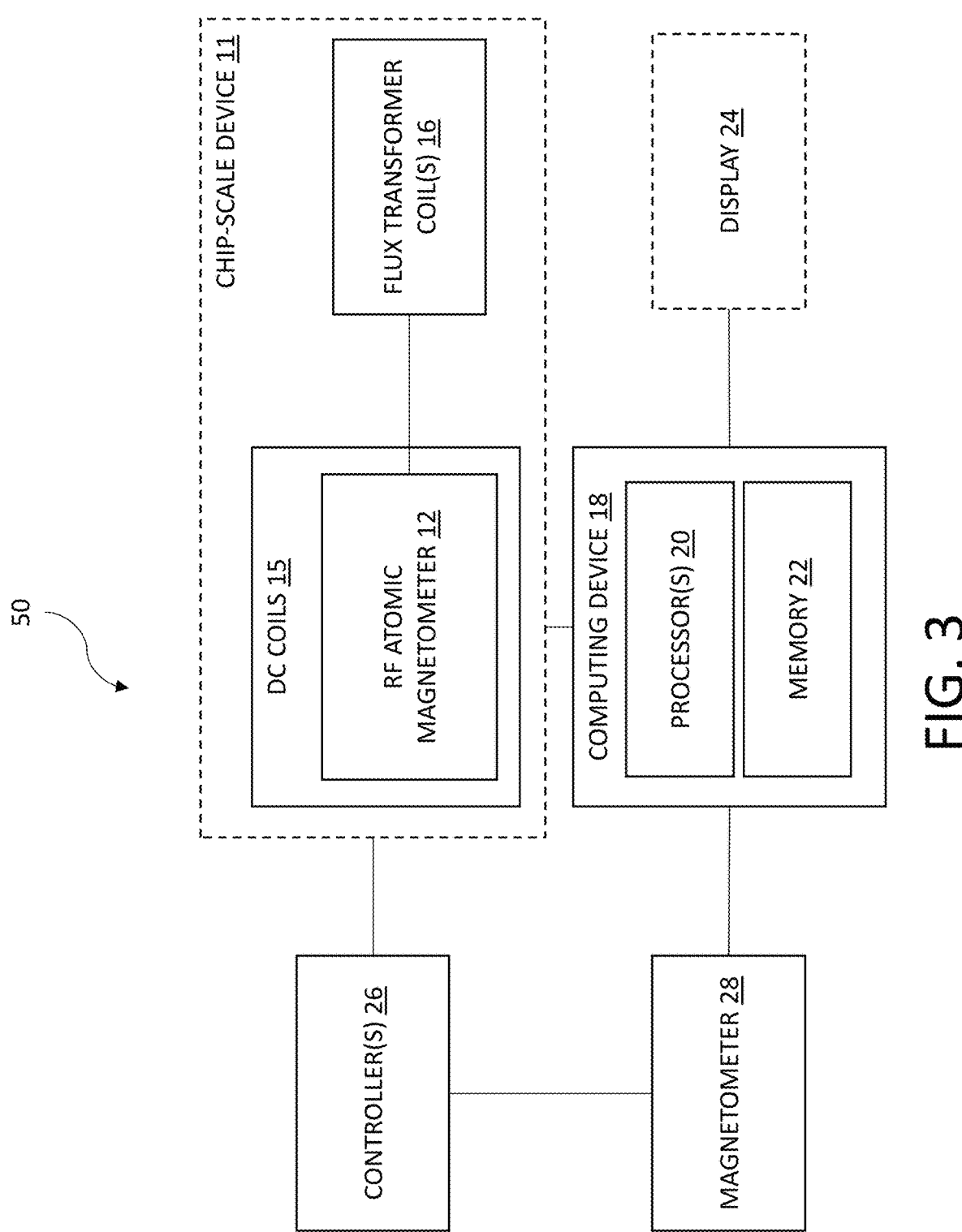
FIG. 3 is a diagram of an example system for performing MRI and/or MEG measurements.

FIG. 3 illustrates an example system 50 for performing MRI and/or MEG measurements. The components of the system 50 are similar to those discussed above for the system 10, and the same reference numbers are used for corresponding components in the systems 10, 50.

In the example shown in FIG. 3, the chip-scale device 11 includes an RF atomic magnetometer 12, a set of DC coils 15 surrounding the RF magnetometer 12, and one or more flux transformer coils 16. However, unlike the system 10 described above with respect to FIG. 1, the chip-scale device 11 of system 50 does not include a passive magnetic shield 14 because the passive magnetic shield would prevent the MEG operation of the system 50 discussed below.

In the example shown in FIG. 3, the system 50 includes a magnetometer 28 configured to determine the external DC field imposed on the sample for MRI. In some examples, the magnetometer 28 is communicatively coupled to the one or more controllers 26 and/or the computing device 18 and configured to provide a measurement of the external DC field to the one or more controllers 26 and/or the computing device 18. In some examples, the one or more controllers 26 and/or the at least one processor 20 are configured to adjust the electrical DC bias applied to the DC field coils 15 to both mitigate the external DC field and to properly tune the atoms in the vapor cell 214, 260.

For MRI operation of the system 50 shown in FIG. 3, the RF atomic magnetometer 12 is shielded against the DC field imposed on the sample for MRI by the set of DC field coils 15 that surround the RF atomic magnetometer 12. In particular, the set of DC field coils 15 are configured to mitigate the external DC field imposed on the sample for MRI. The functionality of the components of the system 50 is otherwise the same compared to that discussed above for system 10 for performing MRI measurements.

In order to perform MEG measurements, the RF atomic magnetometer 12 of the system 50 is reconfigured to operate as a SERF magnetometer. For operation as a SERF magnetometer, the sensing volume is generally shielded from external fields because no signals will be produced in the presence of magnetic fields stronger than about 200 nT. Therefore, for proper measurement of MEG signals, the system 50 needs to operate in a near-zero field environment, which can be produced by operating the system in a shielded room.

Further, in order to reduce the magnetic fields on the sample and to enable detection of the MEG signals using the components of the system 50, the DC field coils 15, the one or more flux transformer coils 16, and the one or more coils 234, 264 in the RF atomic magnetometer 12 are disabled. In some examples, the one or more controllers 26 or the at least one processor 20 are configured to disconnect or otherwise disable the DC field coils 15, the one or more flux transformer coils 16, and the one or more coils 234, 264 in the RF atomic magnetometer 12.

Some other important factors for operation as a SERF magnetometer relate to the buffer gas pressure in the vapor cell 214, 260 and the operating temperature. In some examples, the system 50 is configured to set the buffer gas pressure in the vapor cell 214, 260 to approximately one atmosphere and the operating temperature is set to approximately 150 C. In some examples, the one or more controllers 26 and/or at least one processor 20 are configured to adjust the buffer gas pressure and operating temperature by controlling one or more heaters in the body 202 or the vacuum package 252 of the RF atomic magnetometer 12.

In the absence of a magnetic field, the spins of the atoms in the vapor cell 214, 260 retain their original orientation, and the polarization of the laser beam 217, 256 remains unchanged. However, when a magnetic field near DC (<100 Hz) is present, the magnetic field twists the orientation slightly, which changes the amount of the light entering the photodetector 216, 262. The laser beam 217, 256 shines through the vapor in the vapor cell 214, 260 and into the photodetector 216, 262 configured to measure the polarization of the arriving light. The light throughput at the photodetector 216, 262 is maximized at zero magnetic field and attenuated as a function of magnetic field. In some examples, the signal from the photodetector 216, 262 is a DC light level (or modulated and demodulated DC light level). An example diagram of the Larmor precession for MEG operation is provided in FIG. 4B.

The photodetector 216, 262 is configured to output the detected signals (RF signal for MRI operation and DC SERF signal for MEG operation) to the computing device 18 for further processing. In some examples, the memory 22 includes one or more instructions that, when executed by the at least one processor 20, cause the at least one processor 20 to analyze the signals from the chip-scale device 11. In some examples, the at least one processor 20 is configured to process the signals from the chip-scale device 11 and output MRI and/or MEG measurements depending on the configuration of the chip-scale device 11 at the time.

In some examples, the optional display 24 communicatively coupled to the computing device 18 can be configured to display the MRI and/or MEG measurements or images generated from the MRI and/or MEG measurements.

The fundamental sensitivity limit for RF atomic magnetometers is given by:

$$\delta\beta = \frac{2}{\gamma}\sqrt{\frac{\overline{v}[G(\omega_0, R_{ex})\sigma_{ex}\sigma_{sd}]^{1/2}}{V_a}}\left(1 + \frac{1}{4\sqrt{\eta}}\right)$$

$$\text{where } G(\omega_0, R_{ex}) = Re\left[\frac{R_{ex} + 4i\omega_0^2/(\pi v_{HF})}{5R_{ex} + 8i\omega_0^2/(\pi v_{HF})}\right]$$

Here $\overline{v}$ is the mean relative thermal velocity of rubidium collisions, $\eta$ is the photodiode efficiency, $V_a$ is the volume of the atomic vapor cell (assuming the whole volume is interacting with the laser and RF fields), $\omega_0$ is the RF angular frequency for the Zeeman resonance, $\gamma$ is the atomic gyromagnetic factor, $\sigma_{ex}$ and $\sigma_{sd}$ are the spin-exchange and spin-destruction collision cross-sections, $R_{ex}=n\sigma_{ex}\overline{v}$ is the spin-exchange rate, n is the number density of the atoms, and $v_{HF}$ is the ground state hyperfine splitting of the alkali atoms.

This yields a sensitivity limit of about 50 fT/Hz$^{1/2}$ for the parameters of the RF atomic magnetometer with rubidium atoms in the vapor cell. Benchtop versions of similar sensors have achieved 7 fT/Hz$^{1/2}$ in NMR measurements, using only a thin aluminum shield. Meanwhile, SERF magnetometry has already been demonstrated for MEG measurements, using devices with a sensitivity of around 15 fT/Hz$^{1/2}$.

Using the above techniques, the system 50 utilizes the same components for both RF and SERF magnetometry, which measure MRI and MEG signals, respectively. Thus, the techniques described for the system 50 have the potential to replace the large, expensive components for both MRI and MEG measurements with a single device.

In order to sample a larger volume of interest for MRI or MEG measurements, an array of the chip-scale devices 11 described above with respect to FIGS. 1-3 can be utilized.

Figure 5A:
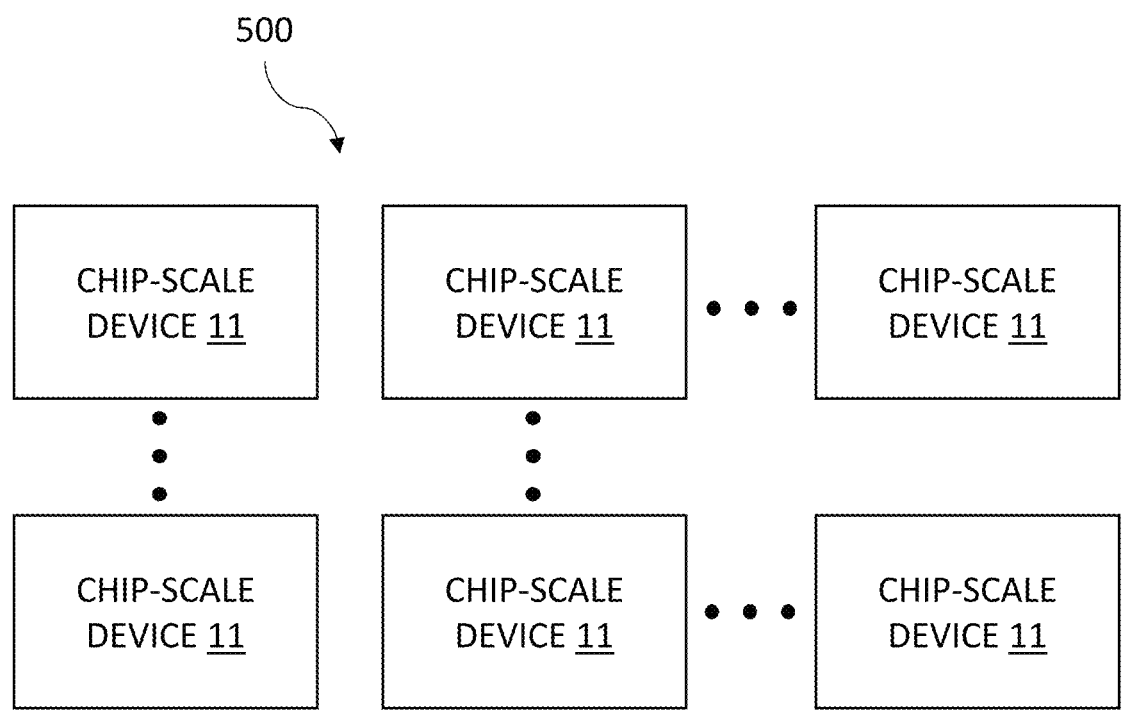
FIG. 5A is a block diagram of an array of chip-scale devices.

FIG. 5A is a block diagram of an example array 500 of chip-scale devices 11. For MRI only operation, the chip-scale device 11 described with respect to the system 10 or the system 50 can be utilized. For MEG only operation or for both MRI and MEG operation with the same array 500, the chip-scale device 11 described with respect to the system 50 can be utilized.

Figure 5B:
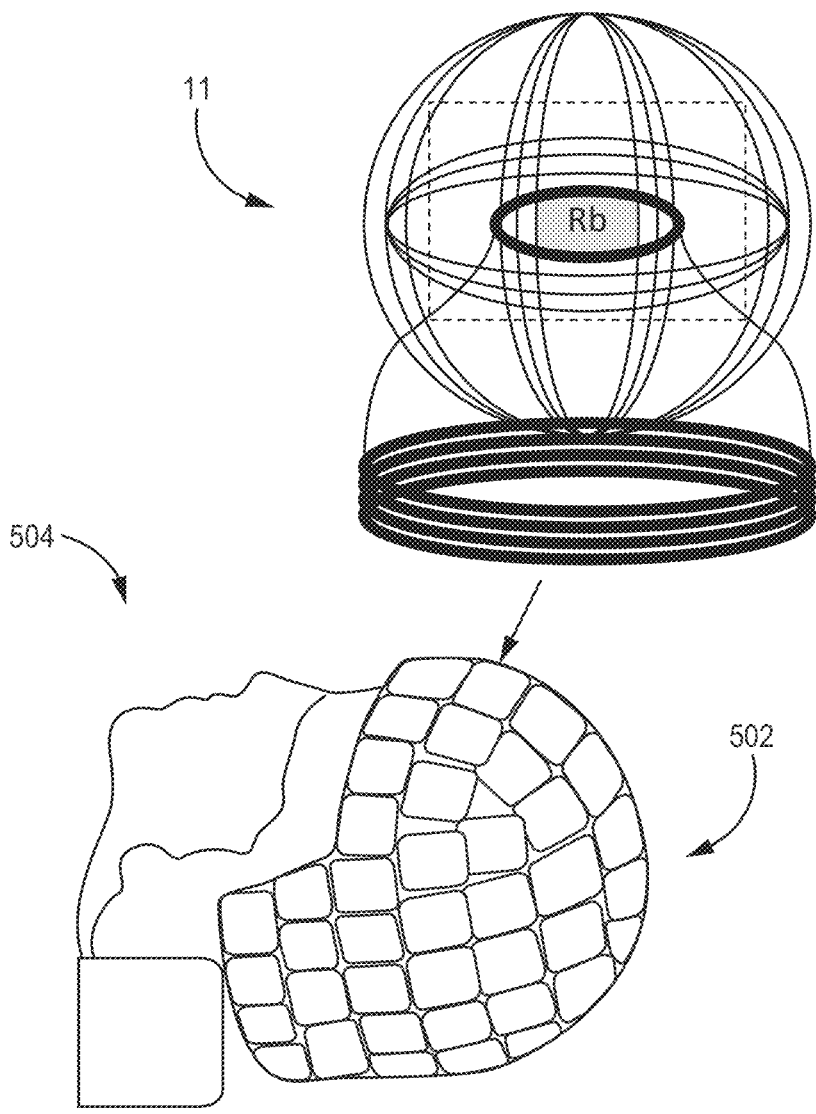
FIG. 5B is a diagram of an example array of chip-scale devices for performing MRI and/or MEG measurements.

FIG. 5B is a diagram of an example array 502 that is configured to be placed on a subject 504. Each of the individual components of the array 502 includes a chip-scale device 11. An example of the chip-scale device 11 corresponding that that described with respect to FIG. 3 is shown in FIG. 5B. In some examples, the one or more flux transformer coils 16 for at least some of the chip-scale devices 11 in the array 500, 502 overlap to completely cover the sample area. In some examples, the chip-scale devices 11 in the array 500, 502 may interfere with each other, so the computing device 18 is configured to estimate the interference and compensate for the interference based on the estimates.

Using the systems described herein, the large, expensive superconducting systems that require cryogenic cooling are not needed to implement MRI or MEG measurements. The size, weight, power, and cost of the systems described herein for performing MRI and/or MEG measurements is significantly less than that for conventional systems. Accordingly, the systems described herein can be deployed in locations (for example, battlefields or underinvested communities) where the technology is currently unavailable.

With portable MRI capabilities, combat surgeons would be much better equipped to determine which injured soldiers need emergency on-site surgery, which ones need to be flown immediately to a fully equipped hospital, which ones will do well receiving local medical care and surveillance, and which ones are suffering from psychiatric but not physical trauma. Further, such imaging techniques could provide navigation data for "self-driving" endotracheal tubes and ER-REBOA catheters, enabling life-saving immediate procedures prior to the arrival of healthcare professionals. It could vastly expand the possibilities of interventional MRI, giving surgeons better access to patients, and allowing them to use metal instruments and robotics. Related Nuclear Magnetic Resonance (NMR) techniques can also be used to analyze fluid and tissue samples, without sending those samples back to a lab.

In various aspects, system elements, or examples described throughout this disclosure (such as the controllers, computing device, or components thereof, for example) may be implemented on one or more computer systems, field programmable gate array (FPGA), application specific integrated circuit (ASIC) or similar devices comprising hardware executing code to realize those elements, processes, or examples, said code stored on a non-transient data storage device. These devices include or function with software programs, firmware, or other computer readable instructions for carrying out various methods, process tasks, calculations, and control functions, used in a distributed antenna system.

These instructions are typically stored on any appropriate computer readable medium used for storage of computer readable instructions or data structures. The computer readable medium can be implemented as any available media that can be accessed by a general purpose or special purpose computer or processor, or any programmable logic device. Suitable processor-readable media may include storage or memory media such as magnetic or optical media. For example, storage or memory media may include conventional hard disks, Compact Disk—Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media may also include transmission media such as electrical, electromagnetic, or digital signals, conveyed via a communication medium such as a network and/or a wireless link.

The techniques described here may be implemented in digital electronic circuitry, or with a programmable processor (for example, a special-purpose processor or a general-purpose processor such as a computer) firmware, software, or in combinations of them. Apparatus embodying these techniques may include appropriate input and output devices, a programmable processor, and a storage medium tangibly embodying program instructions for execution by the programmable processor. A process embodying these techniques may be performed by a programmable processor executing a program of instructions to perform desired functions by operating on input data and generating appropriate output. The techniques may advantageously be implemented in one or more programs that are executable on a programmable system including at least one programmable processor coupled to receive data and instructions from, and to transmit data and instructions to, a data storage system, at least one input device, and at least one output device. Generally, a processor will receive instructions and data from a read-only memory and/or a random access memory. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto-optical disks; and DVD disks. Any of the foregoing may be supplemented by, or incorporated in, specially-designed application-specific integrated circuits (ASICs).

EXAMPLE EMBODIMENTS

Example 1 includes a system, comprising: a chip-scale device that includes: a radio frequency atomic magnetometer that includes: a laser configured to emit laser light; a photodetector; a vapor cell in an optical path of laser light between the laser and photodetector; and a circular polarizer configured to circularly polarize the laser light emitted by the laser, wherein a circularly polarized laser beam is configured to pump into an oriented state, spins of atoms in the vapor cell and to probe the atoms in the vapor cell, wherein probing includes detecting a local radio frequency field; one or more flux transformer coils configured to couple radio frequency signals from a source to the radio frequency atomic magnetometer; and a set of direct current (DC) coils comprising at least one coil, wherein the set of DC coils is configured to generate a DC magnetic field oriented at 45 degrees relative to an optical axis of the laser light emitted by the laser.

Example 2 includes the system of Example 1, further comprising a passive magnetic shield surrounding the radio frequency atomic magnetometer and the set of DC coils.

Example 3 includes the system of Example 1, further comprising one or more processors and a second magnetometer, wherein the one or more processors are communicatively coupled to the set of DC coils and the second magnetometer, wherein the second magnetometer is configured to detect an external DC field and provide a measurement of the external DC field to the one or more processors, wherein the one or more processors are configured to adjust a DC electrical bias for the set of DC coils to mitigate the detected external DC field.

Example 4 includes the system of any of Examples 1 and 3, further comprising one or more processors, wherein the one or more processors are communicatively coupled to the set of DC coils and the one or more flux transformer coils, wherein the one or more processors are configured to: disable the set of DC coils and the one or more flux transformer coils; and configure the radio frequency atomic magnetometer to operate as a Spin Exchange Relaxation-Free (SERF) magnetometer.

Example 5 includes the system of any of Examples 1 and 3-4, further comprising one or more processors and one or more heaters proximate the vapor cell, wherein the one or more processors are communicatively coupled to the one or more heaters, wherein the one or more processors are configured to adjust a pressure of a buffer gas in the vapor cell and/or an operating temperature of the vapor cell by controlling the one or more heaters.

Example 6 includes the system of any of Examples 1-5, wherein the one or more flux transformer coils includes one or more first coils external to the radio frequency atomic magnetometer and one or more second coils proximate the vapor cell, wherein the one or more first coils are configured to couple RF signals to the one or more second coils.

Example 7 includes the system of any of Examples 1 and 3-6, further comprising one or more processors communicatively coupled to the chip-scale device, wherein the one or more processors are configured to receive first electrical signals from the photodetector indicative of a radio frequency field strength during an MRI mode of operation, wherein the one or more processors are configured to receive second electrical signals from the photodetector indicative of a DC field strength during an MEG mode of operation.

Example 8 includes the system of any of Examples 1-7, further comprising one or more processors communicatively coupled to the chip-scale device, wherein the one or more processors are configured to adjust a DC electrical bias for the set of DC coils to tune a frequency of precession of electrons of the atoms in the vapor cell to match the frequency of precession of protons of the source.

Example 9 includes a system, comprising: a plurality of chip-scale devices arranged in an array, wherein each respective chip-scale device of the plurality of chip-scale devices includes: a radio frequency atomic magnetometer that includes: a laser configured to emit laser light; a photodetector; a vapor cell in an optical path of laser light between the laser and photodetector; and a circular polarizer configured to circularly polarize the laser light emitted by the laser, wherein a circularly polarized laser beam is configured to pump into an oriented state, spins of atoms in the vapor cell and to probe the atoms in the vapor cell, wherein probing includes detecting a local radio frequency field; one or more flux transformer coils configured to couple radio frequency signals from a source to the radio frequency atomic magnetometer; and a set of direct current (DC) coils comprising at least one coil, wherein the set of DC coils is configured to generate a DC magnetic field oriented at 45 degrees relative to an optical axis of the laser light emitted by the laser.

Example 10 includes the system of Example 9, wherein at least one chip-scale device of the plurality of chip-scale devices includes a passive magnetic shield surrounding the radio frequency atomic magnetometer and the set of DC coils of the at least one chip-scale device of the plurality of chip-scale devices.

Example 11 includes the system of Example 9, further comprising one or more processors and a second magnetometer, wherein the one or more processors are communicatively coupled to the second magnetometer and at least one chip-scale device of the plurality of chip-scale devices, wherein the second magnetometer is configured to detect an external DC field and provide a measurement of the external DC field to the one or more processors, wherein the one or more processors are configured to adjust a DC electrical bias for the respective set of DC coils of the at least one chip-scale device of the plurality of chip-scale devices to mitigate the detected external DC field.

Example 12 includes the system of any of Examples 9 and 11, further comprising one or more processors, wherein the one or more processors are communicatively coupled to each respective chip-scale device of the plurality of chip-scale devices, wherein the one or more processors are configured to: disable each respective set of DC coils and each of the respective one or more flux transformer coils; and configure each respective radio frequency atomic magnetometer to operate as a Spin Exchange Relaxation-Free (SERF) magnetometer.

Example 13 includes the system of any of Examples 9-12, wherein at least some of the respective one or more flux transformer coils of a first chip-scale device of the plurality of chip-scale devices overlap at least some of the respective one or more flux transformer coils of a second chip-scale device of the plurality of chip-scale devices.

Example 14 includes a system, comprising: a chip-scale device that includes: a radio frequency atomic magnetometer that includes: a laser configured to emit laser light; a photodetector; a vapor cell in an optical path of laser light between the laser and photodetector; and a circular polarizer configured to circularly polarize the laser light emitted by the laser, wherein a circularly polarized laser beam is configured to pump into an oriented state, spins of atoms in the vapor cell and to probe the atoms in the vapor cell, wherein probing includes detecting a local radio frequency field; one or more flux transformer coils configured to couple radio frequency signals from a source to the radio frequency atomic magnetometer; and a set of direct current (DC) coils comprising at least one coil, wherein the set of DC coils is configured to generate a DC magnetic field oriented at 45 degrees relative to an optical axis of the laser light emitted by the laser; a second magnetometer configured to detect an external DC field; one or more processors communicatively coupled to the chip-scale device and the second magnetometer; wherein the system is configured to operate in a magnetic resonance imaging (MRI) mode of operation and a magnetoencephalography (MEG) mode of operation.

Example 15 includes the system of Example 14, wherein, for the MRI mode of operation, the one or more processors are configured to adjust a DC electrical bias for the set of DC coils to mitigate the detected external DC field.

Example 16 includes the system of any of Examples 14-15, wherein the one or more flux transformer coils includes one or more first coils external to the radio frequency atomic magnetometer and one or more second coils proximate the vapor cell, wherein the one or more first coils are configured to couple radio frequency signals to the one or more second coils.

Example 17 includes the system of any of Examples 14-16, wherein, for the MRI mode of operation, the one or more processors are configured to adjust a DC electrical bias for the set of DC coils to tune a frequency of precession of electrons of the atoms in the vapor cell to match the frequency of precession of protons of the source.

Example 18 includes the system of any of Examples 14-17, wherein the photodetector is configured to provide a radio frequency output to the one or more processors when the system is operating in the MRI mode of operation, wherein the photodetector is configured to provide a DC output to the one or more processors when the system is operating in the MEG mode of operation.

Example 19 includes the system of any of Examples 14-18, wherein, for the MEG mode of operation, the one or more processors are configured to: disable the set of DC coils and the one or more flux transformer coils; and configure the radio frequency atomic magnetometer to operate as a Spin Exchange Relaxation-Free (SERF) magnetometer.

Example 20 includes the system of any of Examples 14-19, further comprising one or more processors and one or more heaters proximate the vapor cell, wherein the one or more processors are communicatively coupled to the one or more heaters, wherein the one or more processors are configured to control the one or more heaters to adjust a pressure of a buffer gas in the vapor cell and/or an operating temperature of the vapor cell.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. A system, comprising:
a chip-scale device that includes:
a radio frequency atomic magnetometer that includes:
a laser configured to emit laser light;
a photodetector;
a vapor cell in an optical path of the laser light between the laser and photodetector; and
a circular polarizer configured to circularly polarize the laser light emitted by the laser to create a circularly polarized laser beam, wherein the circularly polarized laser beam is a single beam configured to pump into an oriented state, spins of atoms in the vapor cell and to probe the atoms in the vapor cell, wherein probing includes detecting a local radio frequency field;
one or more flux transformer coils configured to couple radio frequency signals from a source to the radio frequency atomic magnetometer; and
a set of direct current (DC) coils comprising at least one coil, wherein the set of DC coils is configured to generate a DC magnetic field oriented at 45 degrees relative to an optical axis of the laser light emitted by the laser.

2. The system of claim 1, further comprising a passive magnetic shield surrounding the radio frequency atomic magnetometer and the set of DC coils.

3. The system of claim 1, further comprising one or more processors and a second magnetometer, wherein the one or more processors are communicatively coupled to the set of DC coils and the second magnetometer, wherein the second magnetometer is configured to detect an external DC field and provide a measurement of the external DC field to the one or more processors, wherein the one or more processors are configured to adjust a DC electrical bias for the set of DC coils to mitigate the detected external DC field.

4. The system of claim 1, further comprising one or more processors, wherein the one or more processors are communicatively coupled to the set of DC coils and the one or more flux transformer coils, wherein the one or more processors are configured to:
disable the set of DC coils and the one or more flux transformer coils; and configure the radio frequency atomic magnetometer to operate as a Spin Exchange Relaxation-Free (SERF) magnetometer.

5. The system of claim 1, further comprising one or more processors and one or more heaters proximate the vapor cell, wherein the one or more processors are communicatively coupled to the one or more heaters, wherein the one or more processors are configured to adjust a pressure of a buffer gas in the vapor cell and/or an operating temperature of the vapor cell by controlling the one or more heaters.

6. The system of claim 1, wherein the one or more flux transformer coils includes one or more first coils external to the radio frequency atomic magnetometer and one or more second coils proximate the vapor cell, wherein the one or more first coils are configured to couple RF signals to the one or more second coils.

7. The system of claim 1, further comprising one or more processors communicatively coupled to the chip-scale device, wherein the one or more processors are configured to receive first electrical signals from the photodetector indicative of a radio frequency field strength during an MRI mode of operation, wherein the one or more processors are configured to receive second electrical signals from the photodetector indicative of a DC field strength during an MEG mode of operation.

8. The system of claim 1, further comprising one or more processors communicatively coupled to the chip-scale device, wherein the one or more processors are configured to adjust a DC electrical bias for the set of DC coils to tune a frequency of precession of electrons of the atoms in the vapor cell to match the frequency of precession of protons of the source.

9. A system, comprising:
a plurality of chip-scale devices arranged in an array, wherein each respective chip-scale device of the plurality of chip-scale devices includes:
a radio frequency atomic magnetometer that includes:
a laser configured to emit laser light;
a photodetector;
a vapor cell in an optical path of the laser light between the laser and photodetector; and
a circular polarizer configured to circularly polarize the laser light emitted by the laser to create a circularly polarized laser beam, wherein the circularly polarized laser beam is single beam configured to pump into an oriented state, spins of atoms in the vapor cell and to probe the atoms in the vapor cell, wherein probing includes detecting a local radio frequency field;
one or more flux transformer coils configured to couple radio frequency signals from a source to the radio frequency atomic magnetometer; and
a set of direct current (DC) coils comprising at least one coil, wherein the set of DC coils is configured to generate a DC magnetic field oriented at 45 degrees relative to an optical axis of the laser light emitted by the laser.

10. The system of claim 9, wherein at least one chip-scale device of the plurality of chip-scale devices includes a passive magnetic shield surrounding the radio frequency atomic magnetometer and the set of DC coils of the at least one chip-scale device of the plurality of chip-scale devices.

11. The system of claim 9, further comprising one or more processors and a second magnetometer, wherein the one or more processors are communicatively coupled to the second magnetometer and at least one chip-scale device of the plurality of chip-scale devices, wherein the second magnetometer is configured to detect an external DC field and provide a measurement of the external DC field to the one or more processors, wherein the one or more processors are configured to adjust a DC electrical bias for the respective set of DC coils of the at least one chip-scale device of the plurality of chip-scale devices to mitigate the detected external DC field.

12. The system of claim 9, further comprising one or more processors, wherein the one or more processors are communicatively coupled to each respective chip-scale device of the plurality of chip-scale devices, wherein the one or more processors are configured to:

disable each respective set of DC coils and each of the respective one or more flux transformer coils; and
configure each respective radio frequency atomic magnetometer to operate as a Spin Exchange Relaxation-Free (SERF) magnetometer.

13. The system of claim 9, wherein at least some of the respective one or more flux transformer coils of a first chip-scale device of the plurality of chip-scale devices overlap at least some of the respective one or more flux transformer coils of a second chip-scale device of the plurality of chip-scale devices.

14. A system, comprising:
a chip-scale device that includes:
a radio frequency atomic magnetometer that includes:
a laser configured to emit laser light;
a photodetector;
a vapor cell in an optical path of the laser light between the laser and photodetector; and
a circular polarizer configured to circularly polarize the laser light emitted by the laser to create a circularly polarized laser beam, wherein the circularly polarized laser beam is a single beam configured to pump into an oriented state, spins of atoms in the vapor cell and to probe the atoms in the vapor cell, wherein probing includes detecting a local radio frequency field;
one or more flux transformer coils configured to couple radio frequency signals from a source to the radio frequency atomic magnetometer; and
a set of direct current (DC) coils comprising at least one coil, wherein the set of DC coils is configured to generate a DC magnetic field oriented at 45 degrees relative to an optical axis of the laser light emitted by the laser;
a second magnetometer configured to detect an external DC field; and
one or more processors communicatively coupled to the chip-scale device and the second magnetometer;
wherein the system is configured to operate in a magnetic resonance imaging (MRI) mode of operation and a magnetoencephalography (MEG) mode of operation.

15. The system of claim 14, wherein, for the MRI mode of operation, the one or more processors are configured to adjust a DC electrical bias for the set of DC coils to mitigate the detected external DC field.

16. The system of claim 14, wherein the one or more flux transformer coils includes one or more first coils external to the radio frequency atomic magnetometer and one or more second coils proximate the vapor cell, wherein the one or more first coils are configured to couple radio frequency signals to the one or more second coils.

17. The system of claim 14, wherein, for the MRI mode of operation, the one or more processors are configured to adjust a DC electrical bias for the set of DC coils to tune a frequency of precession of electrons of the atoms in the vapor cell to match the frequency of precession of protons of the source.

18. The system of claim 14, wherein the photodetector is configured to provide a radio frequency output to the one or more processors when the system is operating in the MRI mode of operation, wherein the photodetector is configured to provide a DC output to the one or more processors when the system is operating in the MEG mode of operation.

19. The system of claim 14, wherein, for the MEG mode of operation, the one or more processors are configured to:
disable the set of DC coils and the one or more flux transformer coils; and configure the radio frequency atomic magnetometer to operate as a Spin Exchange Relaxation-Free (SERF) magnetometer.

20. The system of claim 14, further comprising one or more processors and one or more heaters proximate the vapor cell, wherein the one or more processors are communicatively coupled to the one or more heaters, wherein the one or more processors are configured to control the one or more heaters to adjust a pressure of a buffer gas in the vapor cell and/or an operating temperature of the vapor cell.

* * * * *